(12) United States Patent
Rasheed et al.

(10) Patent No.: US 9,834,840 B2
(45) Date of Patent: Dec. 5, 2017

(54) PROCESS KIT SHIELD FOR IMPROVED PARTICLE REDUCTION

(75) Inventors: Muhammad Rasheed, San Jose, CA (US); Rongjun Wang, Dublin, CA (US); Zhendong Liu, San Jose, CA (US); Xinyu Fu, Pleasanton, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 464 days.

(21) Appl. No.: 13/106,392

(22) Filed: May 12, 2011

(65) Prior Publication Data

US 2011/0278165 A1 Nov. 17, 2011

Related U.S. Application Data

(60) Provisional application No. 61/334,858, filed on May 14, 2010, provisional application No. 61/417,050, filed on Nov. 24, 2010.

(51) Int. Cl.
| | |
|---|---|
| *C23C 14/35* | (2006.01) |
| *C23C 14/56* | (2006.01) |
| *H01J 37/32* | (2006.01) |
| *H01J 37/34* | (2006.01) |

(52) U.S. Cl.
CPC ............ *C23C 14/35* (2013.01); *C23C 14/564* (2013.01); *H01J 37/32853* (2013.01); *H01J 37/32871* (2013.01); *H01J 37/34* (2013.01); *H01J 37/3411* (2013.01)

(58) Field of Classification Search
USPC ..................................................... 204/298.11
See application file for complete search history.

(56) References Cited

U.S. PATENT DOCUMENTS

| | | | | |
|---|---|---|---|---|
| 5,658,442 | A * | 8/1997 | Van Gogh et al. | 204/298.12 |
| 5,690,795 | A | 11/1997 | Rosenstein et al. | |
| 5,824,197 | A * | 10/1998 | Tanaka | 204/192.12 |
| 6,013,159 | A | 1/2000 | Adams et al. | |
| 6,149,784 | A * | 11/2000 | Su et al. | 204/298.11 |
| 6,709,556 | B2 * | 3/2004 | Green | 204/298.07 |
| 7,501,161 | B2 | 3/2009 | Hou et al. | |
| 7,718,045 | B2 | 5/2010 | Tiller et al. | |

(Continued)

OTHER PUBLICATIONS

International Search Report and Written Opinion mailed Jan. 4, 2011 for PCT Application No. PCT/US2011/036395.

(Continued)

*Primary Examiner* — Stefanie S Wittenberg
(74) *Attorney, Agent, or Firm* — Moser Taboada; Alan Taboada (57) ABSTRACT

Apparatus for improved particle reduction are provided herein. In some embodiments, an apparatus may include a process kit shield comprising a one-piece metal body having an upper portion and a lower portion and having an opening disposed through the one-piece metal body, wherein the upper portion includes an opening-facing surface configured to be disposed about and spaced apart from a target of a physical vapor deposition chamber and wherein the opening-facing surface is configured to limit particle deposition on an upper surface of the upper portion of the one-piece metal body during sputtering of a target material from the target of the physical vapor deposition chamber.

12 Claims, 4 Drawing Sheets

(56) References Cited

U.S. PATENT DOCUMENTS

| | | | |
|---|---|---|---|
| 7,981,262 B2 | 7/2011 | Pavloff et al. | |
| 2002/0108571 A1* | 8/2002 | Black et al. | 118/715 |
| 2002/0166762 A1* | 11/2002 | Hixson et al. | 204/192.12 |
| 2003/0217913 A1 | 11/2003 | Hong et al. | |
| 2004/0094402 A1* | 5/2004 | Gopalraja et al. | 204/192.12 |
| 2005/0133361 A1 | 6/2005 | Ding et al. | |
| 2005/0271984 A1* | 12/2005 | Brueckner | C23C 14/564 430/323 |
| 2006/0110620 A1* | 5/2006 | Lin et al. | 428/650 |
| 2007/0102286 A1* | 5/2007 | Scheible | C23C 14/3407 204/298.01 |
| 2008/0257263 A1* | 10/2008 | Pavloff et al. | 118/723 R |
| 2010/0055298 A1* | 3/2010 | Sommers et al. | 427/58 |
| 2010/0252416 A1 | 10/2010 | Liu et al. | |

OTHER PUBLICATIONS

Search Report from The State Intellectual Property Office of the People's Republic of China dated May 27, 2014 for Chinese Patent Application No. 201180029451.2.

* cited by examiner

PROCESS KIT SHIELD FOR IMPROVED PARTICLE REDUCTION

CROSS-REFERENCE TO RELATED APPLICATIONS

This application claims benefit of U.S. provisional patent application Ser. No. 61/334,858, filed May 14, 2010, and U.S. provisional patent application Ser. No. 61/417,050, filed Nov. 24, 2010, which are herein incorporated by reference.

FIELD

Embodiments of the present invention generally relate to substrate processing equipment, and more specifically to process kit shields for use in substrate processing equipment.

BACKGROUND

A process kit shield may be used in, for example, a radio frequency physical vapor deposition (RF-PVD) chamber to separate a processing volume from a non-processing volume. Typically the process kit shield comprises two separate components, a metallic lower portion and a ceramic upper portion, wherein the ceramic upper portion is utilized to prevent arcing between a target of the RF-PVD chamber and the metallic lower portion of the process kit shield. Unfortunately, the inventors have discovered that particles, for example, such as particles formed from target material of a target disposed in the processing volume of the RF-PVD chamber, collect on surfaces of the ceramic upper portion of the process kit shield and in spaces between the metallic lower portion and ceramic upper portion of the process kit shield. Ultimately, the collected particles may deposit on the surfaces of a substrate being processed in the processing volume and for example create defects in a device being formed on the substrate or generally contaminate a layer being formed on the substrate.

Accordingly, the inventors have provided the process kit shield disclosed herein to solve problems associated with particle contamination from a process kit shield.

SUMMARY

Apparatus for improved particle reduction are provided herein. In some embodiments, an apparatus may include a process kit shield comprising a one-piece metal body having an upper portion and a lower portion and having an opening disposed through the one-piece metal body, wherein the upper portion includes an opening-facing surface configured to be disposed about and spaced apart from a target of a physical vapor deposition chamber and wherein the opening-facing surface is configured to limit particle deposition on an upper surface of the upper portion of the one-piece metal body during sputtering of a target material from the target of the physical vapor deposition chamber.

In some embodiments, an apparatus may include a process chamber having a processing volume and a non-processing volume; a substrate support disposed in the process chamber; a target disposed in the process chamber opposite the substrate support; and a process kit shield disposed in the process chamber and separating the processing volume from the non-processing volume, the process kit shield comprising a one-piece metal body having an upper portion and a lower portion and having the processing volume formed in an interior volume of the one-piece metal body between the substrate support and the target, wherein the upper portion includes a processing volume-facing surface configured to be disposed about and spaced apart from the target and wherein the processing volume-facing surface is configured to limit particle deposition on an upper surface of the upper portion of the one-piece metal body during sputtering of the target material from the target.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for improving particle reduction in process chambers is provided herein. The inventive process kit shield may advantageous reduce particle formation on surface of the process kit shield during RF-PVD processes while limiting arcing between the process kit shield and the target.

Figure 1:
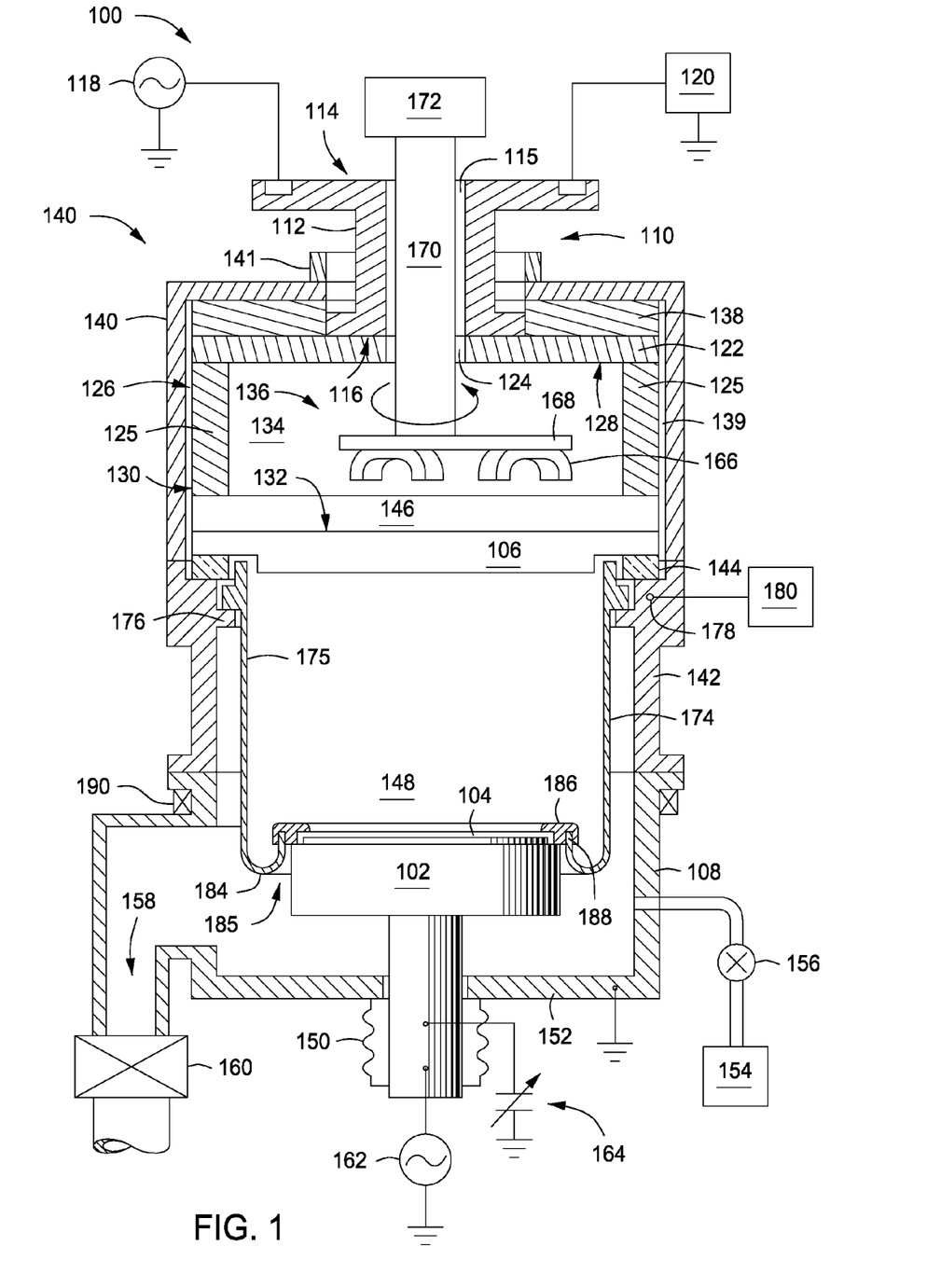
FIG. 1 depicts a schematic cross sectional view of a process chamber in accordance with some embodiments of the present invention.

FIG. 1 depicts a schematic, cross-sectional view of a physical vapor deposition chamber (processing chamber 100) in accordance with some embodiments of the present invention. Examples of suitable PVD chambers include the ALPS® Plus and SIP ENCORE® PVD processing chambers, both commercially available from Applied Materials, Inc., of Santa Clara, Calif. Other processing chambers from Applied Materials, Inc. or other manufactures may also benefit from the inventive apparatus disclosed herein.

The processing chamber 100 contains a substrate support pedestal 102 for receiving a substrate 104 thereon, and a sputtering source, such as a target 106. The substrate support pedestal 102 may be located within a grounded enclosure wall 108, which may be a chamber wall (as shown) or a grounded shield (a ground shield 140 is shown covering at least some portions of the chamber 100 above the target 106. In some embodiments, the ground shield 140 could be extended below the target to enclose the pedestal 102 as well.).

The processing chamber includes a tubular feed structure 110 for coupling RF and DC energy to the target 106. The feed structure is an apparatus for coupling RF and DC energy to the target, or to an assembly containing the target, for example, as described herein. As used herein, tubular refers generally to a hollow member having any general cross-section, and not just circular cross-sections. The feed structure 110 includes a body 112 having a first end 114 and a second end 116 opposite the first end 114. The body 112 further includes a central opening 115 disposed through the body 112 from the first end 114 to the second end 116.

The first end 114 of the feed structure 110 can be coupled to an RF power source 118 and a DC power source 120, which can be respectively utilized to provide RF and DC energy to the target 106. For example, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure 110 may be fabricated from suitable conductive materials to conduct the RF and DC energy from the RF power source 118 and the DC power source 120.

The feed structure 110 may have a suitable length that facilitates substantially uniform distribution of the respective RF and DC energy about the perimeter of the feed structure 110. For example, in some embodiments, the feed structure 110 may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure 110 (i.e., the RF energy is more uniformly distributed about the feed structure to approximate RF coupling to the true center point of the feed structure 110. The inner diameter of the feed structure 110 (i.e., the diameter of the central opening 115) may be as small as possible, for example, from about 1 inch to about 6 inches, or about 4 inches in diameter. Providing a smaller inner diameter facilitates improving the length to ID ratio without increasing the length of the feed structure 110.

The second end 116 of the body 112 is coupled to a source distribution plate 122. The source distribution plate includes a hole 124 disposed through the source distribution plate 122 and aligned with the central opening 115 of the body 112. The source distribution plate 122 may be fabricated from suitable conductive materials to conduct the RF and DC energy from the feed structure 110.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is fluidly coupled to the central opening 115 of the body 112 via the hole 124 of the source distribution plate 122. The cavity 134 and the central opening 115 of the body 112 may be utilized to at least partially house one or more portions of a rotatable magnetron assembly 136 as illustrated in FIG. 1 and described further below. In some embodiments, the cavity may be at least partially filled with a cooling fluid, such as water (H$_2$O) or the like.

A ground shield 140 may be provided to cover the outside surfaces of the lid of the process chamber 100. The ground shield 140 may be coupled to ground, for example, via the ground connection of the chamber body. The ground shield 140 has a central opening to allow the feed structure 110 to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

In some embodiments, a ground collar 141 may be disposed about body 112 and lower portion 204 of the feed structure 110. The ground collar 141 is coupled to the ground shield 140 and may be an integral part of the ground shield 140 or a separate part coupled to the ground shield to provide grounding of the feed structure 110. The ground collar 141 may be made from a suitable conductive material, such as aluminum or copper. In some embodiments, a gap disposed between the inner diameter of the ground collar 141 and the outer diameter of the body 112 of the feed structure 110 may be kept to a minimum and be just enough to provide electrical isolation. The gap can be filled with isolating material like plastic or ceramic or can be an air gap. The ground collar 141 prevents cross-talk between the RF feed and the body 112, thereby improving plasma, and processing, uniformity.

An isolator plate 138 may be disposed between the source distribution plate 122 and the ground shield 140 to prevent the RF and DC energy from being routed directly to ground. The isolator plate 138 has a central opening to allow the feed structure 110 to pass through the isolator plate 138 and be coupled to the source distribution plate 122. The isolator plate 138 may comprise a suitable dielectric material, such as a ceramic, a plastic, or the like. Alternatively, an air gap may be provided in place of the isolator plate 138. In embodiments where an air gap is provided in place of the isolator plate, the ground shield 140 may be structurally sound enough to support any components resting upon the ground shield 140.

The target 106 may be supported on a grounded, conductive sidewall of the chamber, referred to in some embodiments as an adapter 142, through a dielectric isolator 144. In some embodiments, the grounded, conductive sidewall of the chamber, or adapter 142, may be fabricated from aluminum. The target 106 comprises a material to be deposited on the substrate 104 during sputtering, such a metal or metal oxide. In some embodiments, the backing plate 146 may be coupled to the source distribution plate-facing surface 132 of the target 106. The backing plate 146 may comprise a conductive material, such as copper-zinc, copper-chrome, or the same material as the target, such that RF and DC power can be coupled to the target 106 via the backing plate 146. Alternatively, the backing plate 146 may be non-conductive and may include conductive elements (not shown) such as electrical feedthroughs or the like for coupling the source distribution plate-facing surface 132 of the target 106 to the second end 130 of the conductive member 125. The backing plate 146 may be included for example, to improve structural stability of the target 106.

The substrate support pedestal 102 has a material-receiving surface facing the principal surface of the target 106 and supports the substrate 104 to be sputter coated in planar position opposite to the principal surface of the target 106. The substrate support pedestal 102 may support the substrate 104 in a central region 148 of the processing chamber 100. The central region 148 is defined as the region above the substrate support pedestal 102 during processing (for example, between the target 106 and the substrate support pedestal 102 when in a processing position).

In some embodiments, the substrate support pedestal 102 may be vertically movable through a bellows 150 connected to a bottom chamber wall 152 to allow the substrate 104 to be transferred onto the substrate support pedestal 102 through a load lock valve (not shown) in the lower portion of processing the chamber 100 and thereafter raised to a deposition, or processing position. One or more processing gases may be supplied from a gas source 154 through a mass flow controller 156 into the lower part of the chamber 100. An exhaust port 158 may be provided and coupled to a pump (not shown) via a valve 160 for exhausting the interior of the processing chamber 100 and facilitating maintaining a desired pressure inside the processing chamber 100.

An RF bias power source 162 may be coupled to the substrate support pedestal 102 in order to induce a negative DC bias on the substrate 104. In addition, in some embodiments, a negative DC self-bias may form on the substrate 104 during processing. For example, RF power supplied by the RF bias power source 162 may range in frequency from about 2 MHz to about 60 MHz, for example, non-limiting frequencies such as 2 MHz, 13.56 MHz, or 60 MHz can be used. In other applications, the substrate support pedestal 102 may be grounded or left electrically floating. For example, a capacitance tuner 164 may be coupled to the substrate support pedestal for adjusting voltage on the substrate 104 for applications where RF bias power may not be desired.

A rotatable magnetron assembly 136 may be positioned proximate a back surface (e.g., source distribution plate-facing surface 132) of the target 106. The rotatable magnetron assembly 136 includes a plurality of magnets 166 supported by a base plate 168. The base plate 168 connects to a rotation shaft 170 coincident with the central axis of the chamber 100 and the substrate 104. A motor 172 can be coupled to the upper end of the rotation shaft 170 to drive rotation of the magnetron assembly 136. The magnets 166 produce a magnetic field within the chamber 100, generally parallel and close to the surface of the target 106 to trap electrons and increase the local plasma density, which in turn increases the sputtering rate. The magnets 166 produce an electromagnetic field around the top of the chamber 100, and magnets 166 are rotated to rotate the electromagnetic field which influences the plasma density of the process to more uniformly sputter the target 106. For example, the rotation shaft 170 may make about 0 to about 150 rotations per minute.

In some embodiments, the chamber 100 may further include a process kit shield 174 connected to a ledge 176 of the adapter 142. The adapter 142 in turn is sealed and grounded to the aluminum chamber sidewall 108. The process kit shield 174 surrounds the central region 148 and includes sidewalls disposed about an opening 185 passing through the process kit shield 174. The sidewalls include a processing volume-facing surface 175 facing the central region 148. Generally, the process kit shield 174 extends downwardly along the walls of the adapter 142 and the chamber wall 108 downwardly to below a top surface of the substrate support pedestal 102 and returns upwardly until reaching a top surface of the substrate support pedestal 102 (e.g., forming a u-shaped portion 184 at the bottom). Alternatively, the bottom-most portion of the process kit shield need not be a u-shaped portion 184 and may have any suitable shape. A cover ring 186 rests on the top of an upwardly extending lip 188 of the process kit shield 174 when the substrate support pedestal 102 is in its lower, loading position but rests on the outer periphery of the substrate support pedestal 102 when it is in its upper, deposition position to protect the substrate support pedestal 102 from sputter deposition. An additional deposition ring (not shown) may be used to shield the periphery of the substrate 104 from deposition. Embodiments of a process kit shield 174 are discussed below in accordance with the present invention.

In some embodiments, one or more heat transfer channels 178 may be provided within (as shown), or adjacent to, the adapter 142 to transfer heat to and/or from the adapter 142. The one or more heat transfer channels 178 may be coupled to a heat transfer fluid supply 180 that may circulate a heat transfer fluid through the one or more heat transfer channels 178. In some embodiments, the heat transfer fluid may be a coolant, such as water, or other suitable coolant. The heat transfer fluid supply 180 may maintain the heat transfer fluid at or near a desired temperature to facilitate the transfer of heat to or from the adapter 142. Controlling the temperature of the adapter 142 advantageously facilitates controlling the temperature of the process kit shield 174. For example, removing heat from the process kit shield 174 during processing reduces the temperature gradient of the process kit shield 174 between processing and idle or off states of the chamber, which reduces particle generation that could arise due to thermal coefficient of thermal expansion mismatch of the process kit shield 174 and any deposited materials that may be present on the process kit shield 174.

In some embodiments, a magnet 190 may be disposed about the chamber 100 for selectively providing a magnetic field between the substrate support pedestal 102 and the target 106. For example, as shown in FIG. 1, the magnet 190 may be disposed about the outside of the chamber wall 108 in a region just above the substrate support pedestal 102 when in processing position. In some embodiments, the magnet 190 may be disposed additionally or alternatively in other locations, such as adjacent the adapter 142. The magnet 190 may be an electromagnet and may be coupled to a power source (not shown) for controlling the magnitude of the magnetic field generated by the electromagnet.

Figure 2:
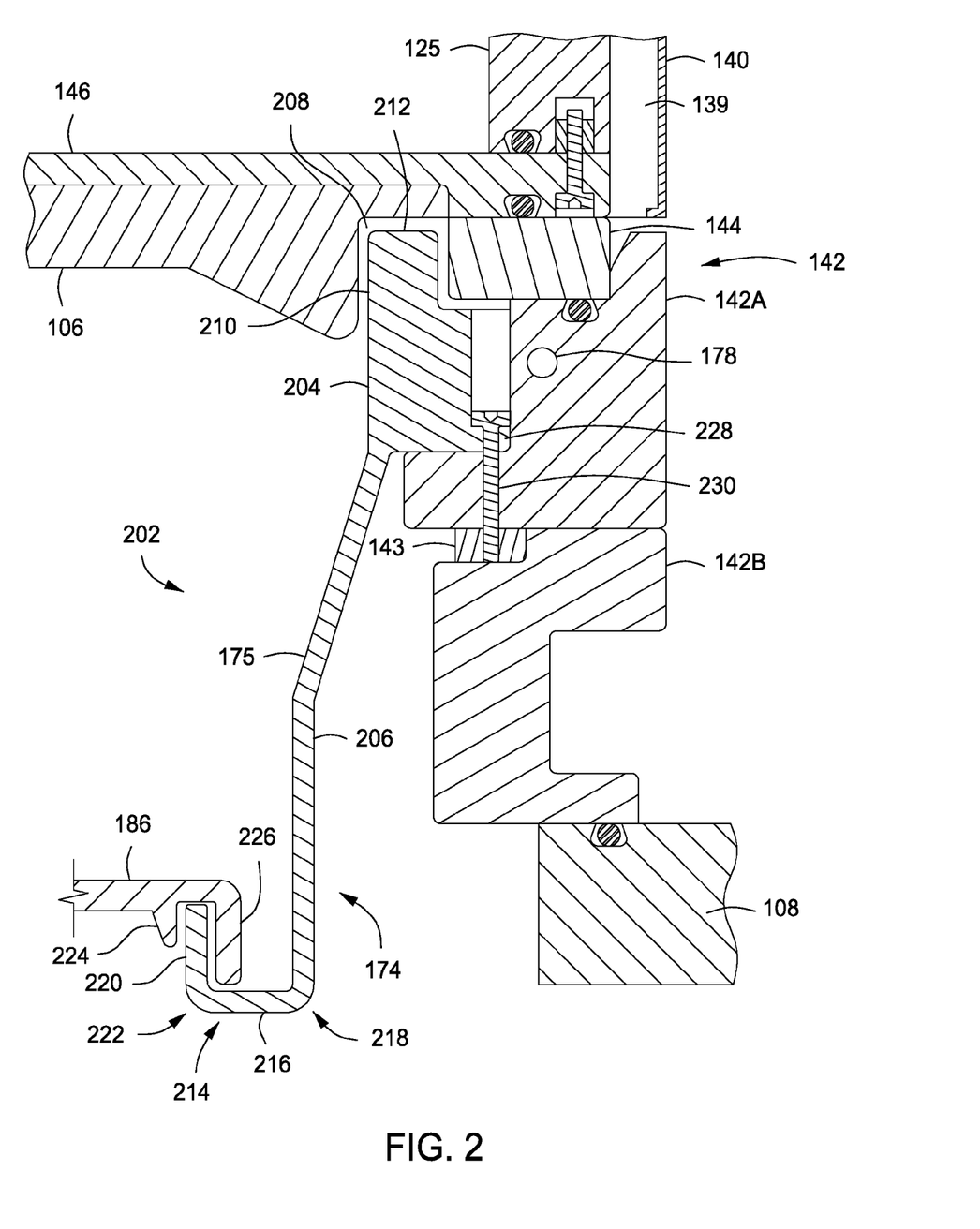
FIG. 2 depicts a schematic cross section view of a process kit shield in accordance with some embodiments of the present invention.

FIG. 2 depicts a schematic cross section view of the process kit shield 174 in accordance with some embodiments of the present invention. The process kit shield 174 includes a one-piece metal body 202 having an upper portion 204 and a lower portion 206. The process kit shield 174 may have a one-piece metal body 202, for example, to eliminate additional surfaces, such as those formed from having a process kit shield formed of multiple pieces. Unfortunately, by forming the process kit shield of a one-piece metal body 202, the option of having a ceramic portion of a process kit shield between a metal portion of a process kit shield and the target 106 to prevent arcing between the metal portion and the target 106 is no longer available. However, the inventors have discovered that arcing between the upper portion 204 of the process kit shield 174 and the target 106 may be limited by increasing the distance of a gap 208 formed between target-facing surfaces 210, 212 of the upper portion 204. In some embodiments, the distance of the gap 208 may be between about 0.25 to about 4 mm, or about 2 mm. The gap 208 formed between the target 106 and the target-facing surfaces 210, 212 may be the same or may be different.

The one-piece metal body 202 may be formed of any suitable metal compatible with RF-PVD processes, such as titanium (Ti), titanium nitride (TiN), tungsten (W), tungsten nitride (WN), copper (Cu), or aluminum (Al) deposition processes. For example, the one-piece metal body 202 may comprise stainless steel, aluminum, titanium, aluminum silicon, copper, or combinations thereof. Further, a surface of the one-piece metal body 202 may be coated with a coating, for example, such that a film that may form on the surface during processing adheres well to the surface and doesn't flake off during processing of a substrate in the process chamber. For example, the coating may be formed by aluminum or titanium arc spraying, or any suitable method. Further, the surface roughness of the coating may range from about 700 to about 1500 micro inches roughness average (Ra), such that any film formed on the coating during processing has limited potential to flake off and contaminate a substrate being processed.

The upper portion 204, for example which may be used to replace a ceramic portion of a conventional process kit shield, is spaced apart from surfaces of the target 106 by the gap 208 such that arcing is limited between the surfaces of the target 106 and target-facing surfaces 210, 212 of the upper portion 204. However, the inventors have further discovered that when the distance of the gap 208 is sufficient to limit or even eliminate arcing between the target 106 and the target-facing surfaces 210, 212, the distance of the gap 208 may additional be sufficient for particles of the target material to collect on horizontal surfaces of the upper portion, such as the target-facing surface 212 (e.g., an upper surface of the upper portion 204). Accordingly, in some embodiments, the distance of the gap 208 may be optimized to balance arcing between the surfaces of the target 106 and the target-facing surfaces 210, 212 of the upper portion 204 of the process kit shield 174.

Figure 3A:
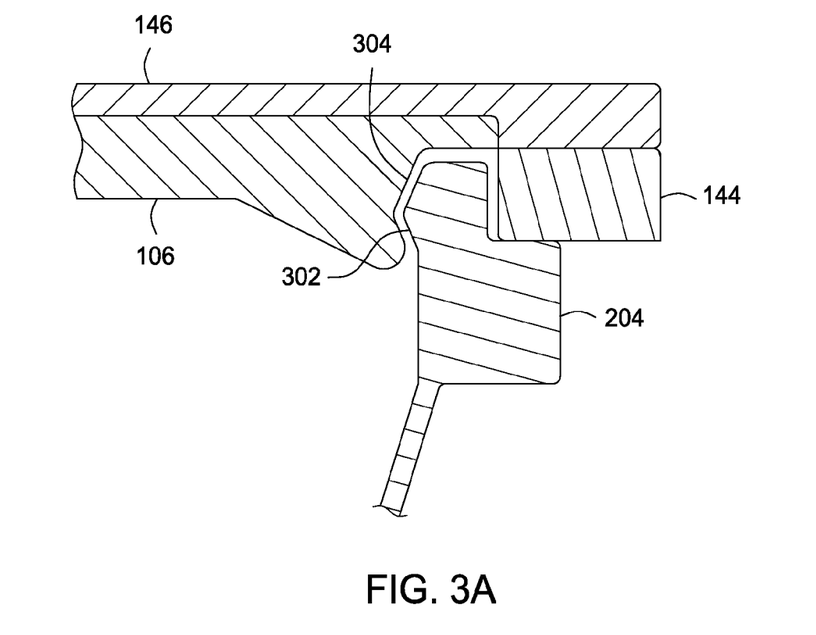
FIGS. 3A-D depict schematic cross section views of a process kit shield in accordance with some embodiments of the present invention.
Figure 3B:
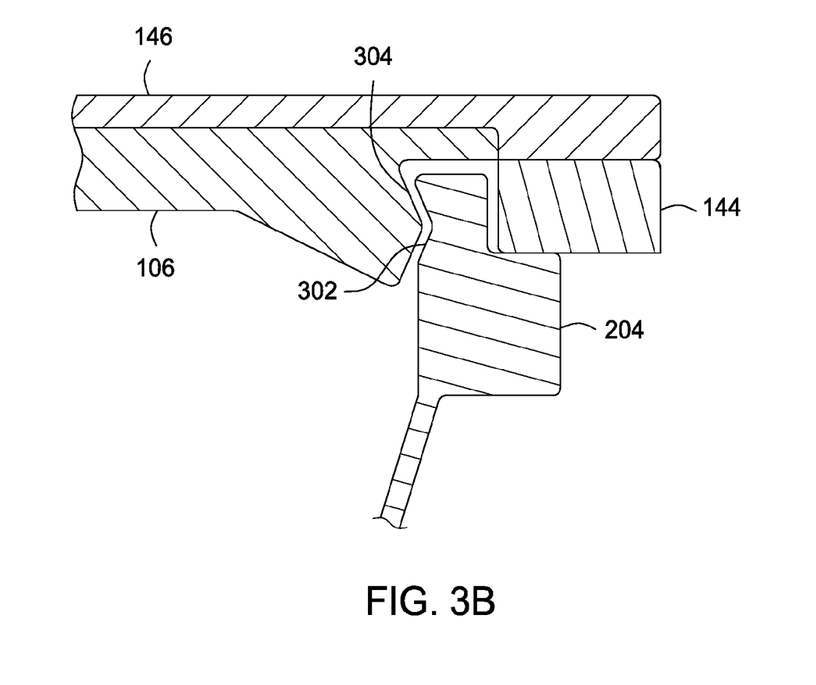

Alternatively, as shown in FIGS. 3A-B, one or more of the target-facing surfaces may be configured to limit particle formation while maintaining a suitable gap distance to limit arcing. For example, the target-facing surface 210 may be replaced with a contoured target-facing surface 302, as shown in FIGS. 3A-B. The contoured target-facing surface 302 may have any suitably shaped contoured surface to limit particles from collecting on, or low energy deposition of material on, the target-facing surface 212. The contoured target-facing surface 302 may limit a direct line of sight or create a tortuous path whereby a particle of the target material, or low energy deposition of the target material, will not reach the horizontal target-facing surface 212 of the upper portion of the process kit shield 174. For example, in some embodiments and as shown in FIG. 3A, the contoured target-facing surface 302 may extend generally inward, e.g., toward the target 106. Alternatively, in some embodiments and as shown in FIG. 3B, the contoured target-facing surface 302 may extend generally outward, e.g., away from the target 106. Other geometries of the contoured target-facing surface 302 may also be used.

Figure 3C:
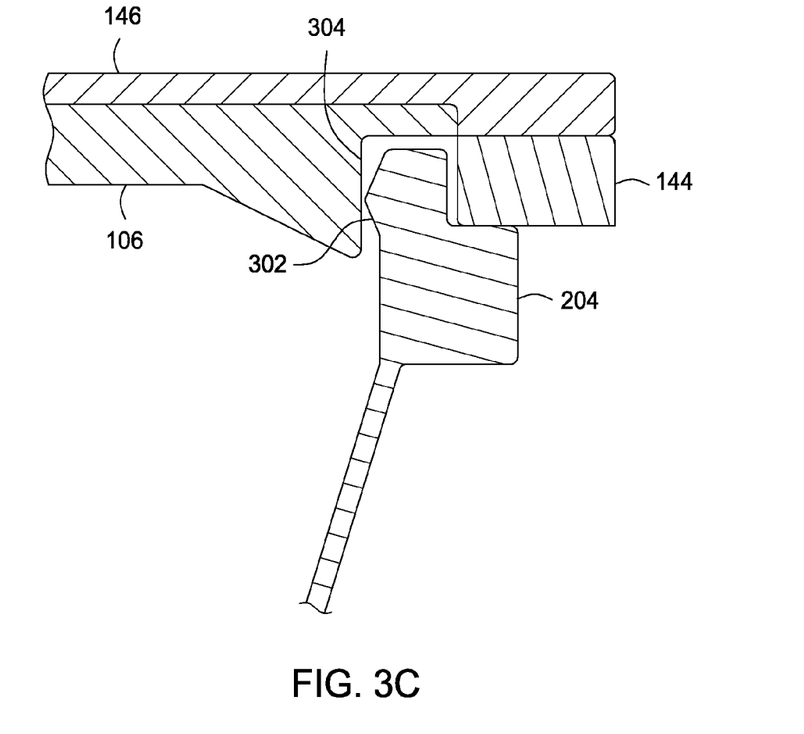

Further, in some embodiments, and as shown in FIGS. 3A-B, a target surface 304 adjacent the contoured target-facing surface 302 may be shaped to generally match the contoured shape of the contoured target-facing surface 302. Alternatively, and as shown in FIG. 3C, a surface of the target 106 adjacent the contoured target-facing surface 302 may not be contoured to match the contoured shape of the contoured target-facing surface 302.

Returning to FIG. 2, the lower portion 206 of the one-piece body 202 includes a lip assembly 214 which interfaces with the cover ring 186. For example, the lip assembly 214 may include a lower surface 216 extending inward from a lower edge 218 of the lower portion 206 of the one-piece metal body 202. As discussed above, the lower surface 216 may take on any suitable shape, such as the u-shaped portion 184 as illustrated in FIG. 1. The lip assembly 214 includes a lip 220 disposed about an inner edge 222 of the lower surface 216 and extending upward from the inner edge 222 of the lower surface towards the upper portion 204 of the one-piece metal body 202. In some embodiments, the lip 220 may extend upwards between adjacent and downward extending inner and outer lips 224, 226 of the cover ring 186.

The lengths of the inner and outer lips 224, 226 of the cover ring 186 and the length of the lip 220 may vary depending on the type of processes being performed in the process chamber 100. For example, in high pressure processes, for example at pressures ranging from about 1 mTorr to about 500 mTorr, the movement of the substrate support may be limited. Accordingly, in high pressure processes, the lip 220 may be about 1 inch in length. Further, the range of motion of the substrate support during a high pressure process may be about 15 mm or less. The lengths of the inner and outer lips 224, 226 may be any suitable length sufficient to cover the range of motion of the substrate support while remaining overlapped with lip 220. The minimum overlap between the lip 220 and at least the outer lip 226 may be about 0.25 inches.

In some embodiment, for example during low pressure processes where the pressure ranging from about 1 mTorr to about 500 mTorr, the lip 220 and the inner and outer lips 224, 226 may be shorter than during high pressure processes. For example, in low pressure processes, the lip 220 may range from about 0 inches to about 5 inches, or about 2.2 inches, in length. Further, in some embodiments, the range of motion of the substrate support during a high pressure process may be about 40 mm (about 1.57 inches) or less. The lengths of the inner and outer lips 224, 226 may be any suitable length sufficient to cover the range of motion of the substrate support while remaining overlapped with lip 220. The minimum overlap between the lip 220 and at least the outer lip 226 may be about 0 inches to about 5 inches.

Figure 3D:
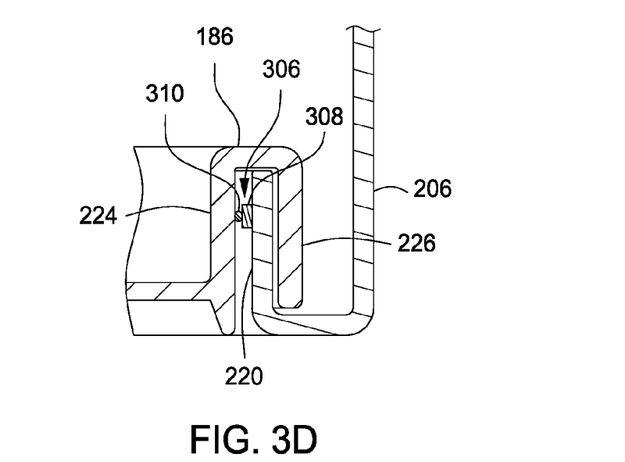

Further as illustrated in FIG. 3D, the process kit shield 174 may include a plurality of alignment devices 306 (only one alignment device 306 is illustrated in FIG. 3D) disposed about an inner lip-facing surface of the lip 220. For example the alignment devices 306 may align the lip 220 to contact the outer lip 226 of the cover ring 186. For example, the lip 220 may be advantageously aligned to contact the outer lip 226 to form a good seal between the lip 220 and the outer lip 226 to maintain pressure in the processing volume or the like. In some embodiments, the alignment devices 306 may advantageously provide concentricity between the cover ring 186 and the process kit shield 174 to define a uniform gap disposed between the cover ring 186 and the process kit shield 174. The uniform gap provide more uniform flow conductance of any gases that may be provided from a lower portion of the chamber.

In some embodiments, each alignment device 306 may include a body 308 and a ball 310. The body may comprise stainless steel, aluminum, or the like. The body 308 may be utilized to hold the ball 310, where the ball contacts the surface of the inner lip 224 of the cover ring 186. The ball 310 may be formed of a hard material, for example, sapphire, stainless steel, alumina, or the like to prevent flaking during contact with the inner lip 224. The ball 310 may alternatively contact the surface of the outer lip 226 of the cover ring 186.

Returning to FIG. 2, the process kit shield 174 may be anchored to the adapter 142. For example, the adapter 142 may include an upper portion 142A and a lower portion 142B (also referred to as an upper adapter and a lower adapter). The upper portion 204 of the one-piece metal body 202 may rest on the upper portion 142A of the adapter 142. The upper portion 204 includes a plurality of holes 228 (only one hole 228 is illustrated in FIG. 2) disposed about the upper portion 204 for placing a screw, bolt or the like therethrough to secure the one-piece metal body 202 against the upper portion 142A of the adapter 142. The upper portion 142A of the adapter 142 similar includes a plurality of holes 230 which are adjacent to each hole 228 for placing the screw, bolt or the like therethrough. The holes 228, 230 may not be threaded, for example, to limit the possibility of virtual leaks due to gases that would become trapped between adjacent threads of the holes and a screw, bolt or the like. The adapter 142 further includes one or more anchoring devices 143 disposed about the one-piece metal body 202 and beneath each hole 230 to receive the screw, bolt, or the like from above the adapter 142A. In some embodiments, one anchoring device may be provided and may be an annular plate Each anchoring device 143 may comprise stainless steel or another hard material suitable for receiving the screw, bolt or the like. Each anchoring device 143 includes a threaded portion for securing the screw, both, or the like.

Apparatus for improving particle reduction in process chambers is provided herein. The inventive process kit shield may advantageous reduce particle formation on surface of the process kit shield during RF-PVD processes while limiting arcing between the process kit shield and the target.

While the foregoing is directed to embodiments of the present invention, other and further embodiments of the invention may be devised without departing from the basic scope thereof.

The invention claimed is:

1. An apparatus for processing a substrate, comprising:
 a process chamber having a processing volume and a non-processing volume;
 a substrate support disposed in the process chamber;
 a target disposed in the process chamber opposite the substrate support;
 a process kit shield disposed in the process chamber and separating the processing volume from the non-processing volume, the process kit shield comprising a one-piece metal body having an upper portion, an intermediate portion, and a lower portion, wherein the upper portion and the lower portion are cylindrical and extend parallel to and along a central axis of the one-piece metal body, and wherein the intermediate portion is conical and extends radially outward from the lower portion toward the upper portion;
 an opening disposed through the one-piece metal body, and having the processing volume formed in an interior volume of the one-piece metal body between the substrate support and the target, wherein a portion of the target extends into the opening, and wherein the upper portion includes an opening-facing contoured surface disposed around and spaced apart from the portion of the target that extends into the opening; and
 a cover ring disposed atop the lower portion of the process kit shield,
 wherein the opening-facing contoured surface extends both radially outward away from the opening and radially inward toward the opening to form a recess, and
 wherein a surface of the portion of the target adjacent to the opening-facing contoured surface is shaped to generally match a shape of the recess of the opening-facing contoured surface to limit a direct line of sight between the processing volume and a space above the upper portion in order to limit particle deposition on an upper surface of the upper portion of the one-piece metal body during sputtering of a target material from the target.

2. The apparatus of claim 1, wherein the one-piece metal body of the process kit shield further comprises:
 a lower surface extending inward from a lower edge of the lower portion of the one-piece metal body into the processing volume; and
 a lip disposed about an inner edge of the lower surface and extending upward from the inner edge of the lower surface towards the upper portion of the one-piece metal body.

3. The apparatus of claim 2, wherein the cover ring is movably disposed atop the substrate support, the cover ring having a lip extending towards the lower surface of the one-piece metal body, wherein the lip of the cover ring is disposed about the lip of the lower portion of the one-piece metal body and selectively movable along an outer surface of the lip of the one-piece metal body.

4. The apparatus of claim 3, further comprising:
 a plurality of alignment devices disposed between a surface of the lip of the one-piece metal body and an opposing surface of the cover ring to radially align the process kit shield with the lip of the cover ring.

5. The apparatus of claim 4, wherein the plurality of alignment devices align the process kit shield with the cover ring to define a radial gap between the lip of the one-piece metal body and the lip of the cover ring, and wherein the radial gap is substantially uniform in thickness.

6. The apparatus of claim 1, wherein the process chamber further comprises:
 a sidewall, wherein the process kit shield is supported within the process chamber by the sidewall.

7. The apparatus of claim 6, wherein the sidewall is a conductive material that is grounded.

8. The apparatus of claim 6, further comprising:
 one or more heat transfer channels disposed in the sidewall proximate the process kit shield to control the temperature of the process kit shield during processing.

9. The apparatus of claim 4, wherein each of the plurality of alignment devices comprise a body and a ball protruding from the body, wherein the body is coupled to the lip of the one-piece metal body such that the ball extends away from the body toward the opposing surface of the cover ring.

10. An apparatus for processing a substrate, comprising:
 a target disposed in a process chamber opposite a substrate support;
 a process kit shield disposed in the process chamber and separating a processing volume from a non-processing volume, the process kit shield comprising a one-piece metal body having an upper portion, a lower portion, an opening disposed through the one-piece metal body, and having the processing volume formed in an interior volume of the one-piece metal body between the substrate support and the target, wherein a portion of the target extends into the opening, and wherein the upper portion includes opening-facing contoured surface disposed around and spaced apart from the portion of the target that extends into the opening; and a cover ring disposed atop the lower portion of the process kit shield;

wherein a surface of the portion of the target adjacent to the opening-facing contoured surface is vertical and straight and wherein the opening-facing contoured surface extends both radially inward and upward toward the opening and radially outward and upward away from the opening to form a generally radially inward projecting protrusion to limit a direct line of sight between the processing volume and a space above the upper portion in order to limit particle deposition on an upper surface of the upper portion of the one-piece metal body during sputtering of a target material from the target.

11. The apparatus of claim 10, further comprising:

a plurality of alignment devices disposed about a surface of the lower portion of the process kit shield to radially align the process kit shield and the cover ring.

12. The apparatus of claim 10, wherein the one-piece metal body further includes an intermediate portion, and wherein inner surfaces of the upper portion and the lower portion are cylindrical and the inner surface of the intermediate portion is conical and extends radially outward from the lower portion toward the upper portion.

\* \* \* \* \*